United States Patent [19]

Peppel

[11] Patent Number: 4,853,834
[45] Date of Patent: Aug. 1, 1989

[54] DEVICE FOR MAINTAINING THE CUT-OFF SWITCHING STATE OF A THYRISTOR THAT CAN BE TURNED OFF

[75] Inventor: Michael Peppel, Weinheim, Fed. Rep. of Germany

[73] Assignee: Siemens Aktiengesellschaft, Berlin and Munich, Fed. Rep. of Germany

[21] Appl. No.: 84,412

[22] Filed: Aug. 10, 1987

[30] Foreign Application Priority Data

Aug. 18, 1986 [DE] Fed. Rep. of Germany ....... 3627935

[51] Int. Cl.$^4$ .............................................. H02H 7/125
[52] U.S. Cl. ........................................ 363/54; 363/57; 307/633
[58] Field of Search ............................. 363/54, 57, 58; 307/633, 252 C; 323/289

[56] References Cited

U.S. PATENT DOCUMENTS

| 3,891,866 | 6/1975 | Okuhara et al. | 307/252 |
| 4,117,350 | 9/1978 | Kalfus et al. | 307/633 |
| 4,417,156 | 11/1983 | Fukui et al. | 307/633 |

FOREIGN PATENT DOCUMENTS

| 0106059 | 4/1984 | European Pat. Off. . |
| 3408516 | 9/1985 | Fed. Rep. of Germany . |
| 3425414 | 1/1986 | Fed. Rep. of Germany . |

Primary Examiner—Patrick R. Salce
Assistant Examiner—Kristine Peckman
Attorney, Agent, or Firm—Kenyon & Kenyon

[57] ABSTRACT

For maintaining the current-blocking switching state of a thyristor that can be turned off, a low-resistance shunt is added between the gate and cathode terminal of the thyristor in the event of a fault, i.e., in case of a failure of the blocking negative gate- cathode voltage. The shunt preferably is a self-conducting field-effect transistor which is kept in the cut-off state, at least with the thyristor turned off by the negative thyristor gate-cathode voltage itself or indirectly by a supply voltage causing this voltage. The drain-source path of the transistor is connected in series with a diode having a low forward voltage in order to prevent undesirable inverse operation of the transistor.

11 Claims, 3 Drawing Sheets

DEVICE FOR MAINTAINING THE CUT-OFF SWITCHING STATE OF A THYRISTOR THAT CAN BE TURNED OFF

BACKGROUND OF THE INVENTION

The present invention relates to a device for maintaining the switching state interrupting the anode-cathode current of a thyristor that can be turned off ("GTO Thyristor") also in the event of a failure of the negative control voltage causing this switching state between the gate and cathode terminal of the thyristor.

GTO (gate turn-off) thyristors, as well known, are distinguished in contrast to conventional thyristors by the provision that the anode-cathode current can be interrupted by the component any time in normal operation by applying a sufficiently negative gate-cathode voltage. The component is thereby switched into the current-blocking switching state without the need to wait for a natural zero crossing of the anode-cathode current. This switching state is preserved in principle also if the cutting-off negative gate-cathode voltage disappears in the meantime, i.e., if the gate terminal is "open". As long as maximally permissible values for the occurring static anode-cathode voltage or its rate of change are not exceeded in the cutoff state, undesirable "head-over firing" of the GTO thyristor need not be expected.

Limits of this kind, however, may be subject to variations which are heavily temperature-dependent and vary from unit to unit. Furthermore, overvoltages with a high rate of rise which frequently act from other circuit parts on the anode-cathode path of the cutoff thyristor cannot be precluded with certainty. For these reasons and because of the need for optimum component utilization, the cutoff behavior must be improved and its maintenance assured under all operating conditions. In the normal operation of a circuit equipped with GTO thyristors, this can be achieved in a simple manner by the provision that the turning-off gate-cathode voltage continues to act on the control path of every thyristor also in its cutoff state. The thermal cut-off current which flows into the thyristor anode in the cut-off state and which can cause with corresponding static and/or dynamic voltage stress of the anode-cathode path, via the so-called "avalanche effect", the head-over firing of the thyristor is conducted off by the applied negative gate-cathode voltage.

In the case of a defect on the other hand, i.e., in the event of a failure of the negative gate-cathode voltage maintaining the cut-off state or in the event of the failure of supply voltages which drive this control voltage indirectly, there is again the danger of head-over firing. Especially in converter circuits, for instance, in inverters, also the power section is heavily affected by short circuits in addition to the causing failure of one or several supply voltages in the control section.

To assure the cut-off behavior of GTO thyristors, especially in the event of a failure of the negative gate-cathode control voltage, it is already known to wire the gate-cathode path with a low-resistance resistor. A device of this type is shown in FIG. 1. There, the resistor acts as a shunt 24 and conducts the thermal cut-off current $-i_G$ coming from the gate terminal GT past the npn transistor structure internal to the thyristor directly to the external cathode terminal K.

However, it is a considerable disadvantage of this device that this resistor causes a considerable power loss especially during the turning off and, in the cut-off state of the thyristor due to the applied negative gate cathode voltage. In addition, the shunt is more effective, the lower its resistance. Thus, considerably more driving power must be made available which causes great expense especially if switching network parts are used. In addition, additional measures are required for removing the heat occurring thereby in the control circuit.

SUMMARY OF THE INVENTION

Therefore, it is an object of the present invention to provide a device, by means of which the cutting-off capacity of the GTO thyristor can be maintained also in the event of a defect, i.e., in particular in the event of a failure of the negative gate-cathode voltage. The normal operation of the thyristor should be affected thereby as little as possible. In particular, additional electric losses should not occur to any noticeable degree.

The above and other objects of the invention are achieved by a device for maintaining the switching state interrupting the anode-cathode current of the thyristor that can be turned off ("GTO Thyristor") in the event of a failure of the negative control voltage $(-U_{GK})$ causing and maintaining this switching state in normal operation between the gate and cathode terminal (GT, K) of the thyristor, characterized by (a) a low-resistance shunt that can be added, of a self-conducting n-channel field effect transistor where the drain and source electrode, respectively, of the field effect transistor is connected to the gate and cathode terminal, respectively, of the thyristor which can be turned off, and (b) means which are connected to the gate electrode (G) of the field effect transistor in such a manner that the latter is in the interrupting switching state if the negative control voltage is present at the thyristor.

BRIEF DESCRIPTION OF THE DRAWINGS

By means of FIGS. 2 to 7, the invention will be explained in greater detail wherein.

DETAILED DESCRIPTION OF THE INVENTION

Figure 1:
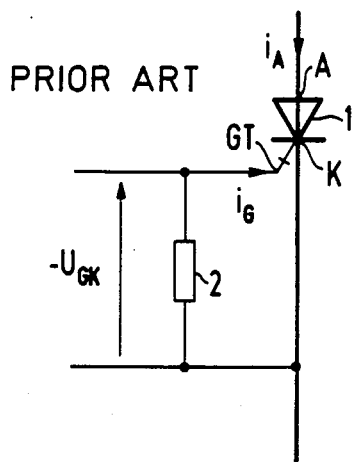
FIG. 1 shows a known type of wiring of the thyristor gate-cathode path.
Figure 2:
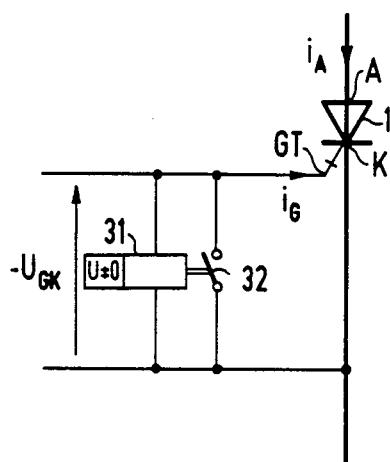
FIG. 2 shows a low resistance shunt which can be added according to the invention for the thyristor gate-cathode path.

In FIG. 2, the basic circuit wiring diagram of the device according to the invention is shown. The electrically controllable switching element is realized here in the form of an electromechanical switch. The latter comprises an electromechanical actuator 31 and a break contact 32 driven thereby. The switch is shown in FIG. 2 in the actuated, i.e., open position. It flips back into the rest position if the d-c voltage $U_{GK}$ of any sign disappears at the actuator 31. With this device it is already possible in a simple manner to add the desired low-resistance shunt in the event of a fault, i.e., in the event of a failure of the thyristor gate-cathode voltages.

In electronic circuits, electromechanical switching elements are often undesirable and can be integrated into the existing circuit concepts only at great expense especially because the control voltage levels may be different. For this reason it is particularly advantageous to employ a electronic component as the electrically controllable switching element. Here again, especially field-effect transistors are particularly well suited because they can be controlled with little power, are easy to control and they have low power loss. Preferably, types are used here which in the event of a failure of the control voltage at the gate electrode, are switched on and thus have self-conducting properties.

Figure 3:
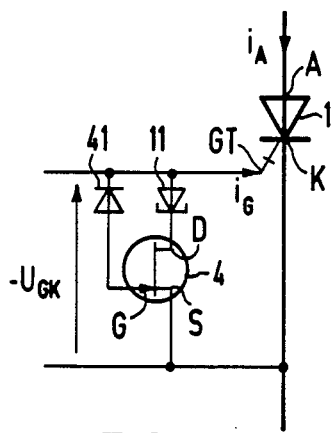
FIG. 3 shows an embodiment of the invention with a barrier layer field-effect transistor as a switching element connected in shunt.

Thus, in the embodiment according to FIG. 3, a self-conducting n-channel barrier layer field-effect transistor 4 is used as the electrically controlled switching element. If an asymmetrically blocking, backwards-conducting type is used as the field-effect transistor, it is particularly advantageous if, for preventing undesired inverted operation of the drain-source conduction path of the transistor, a diode with a low forward voltage is connected in series. Such a diode 11 is already contained in the circuit of FIG. 3, which has a conduction direction oriented from the gate to the cathode terminal of the GTO thyristor. In this embodiment, the gate electrode G of the transistor is connected to the gate terminal GT of the thyristor 1 via a further diode 41 arranged in the forward direction. The field effect transistor is chosen so that the negative thyristor-gate-cathode voltage occurring in normal operation is lower than the pinched-off voltage of the transistor and the latter is therefore cut off. The transistor becomes conducting only if either the thyristor gate-cathode voltage disappears or becomes positive when the thyristor is switched on. In the first case, the fault case under consideration applies, in which the transistor builds up the low-resistance shunt for discharging the thermal cutoff current. Because of the way the diode 41 is poled, the transistor conducts also if the voltage UGK is positive. Since, however, in this case a very small thyristor gate-cathode voltage occurs due to the physical effects when the thyristor is switched on, which is imaged in turn at the transistor as the drain-source voltage, the former is operated far in the so-called "ohmic region" of its field of output characteristics. Thus, the drain-current of the transistor which occurs as a driving loss which is lost to the positive control current $i_G$ into the gate of the thyristor is relatively small.

Figure 4:
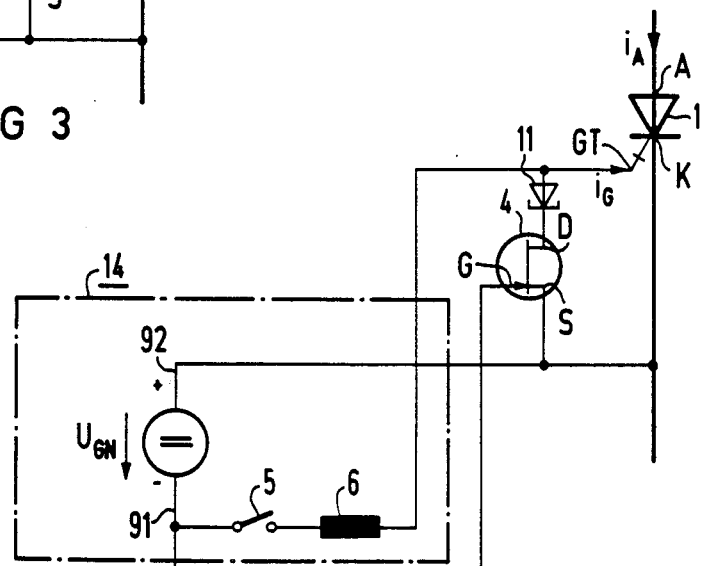
FIG. 4 shows a further embodiment with a driver for switching off the thyristor and for driving the field-effect transistor.

A further advantageous embodiment of the device according to the invention is shown in FIG. 4. It contains an additional driver 14 for making available the negative thyristor gate-cathode voltage $-U_{GK}$ which switches the thyristor off and maintains the cut-off state. An essential component of the driver is a supply voltage source $U_{GN}$, the positive potential of which is connected at the terminal 92 to the cathode terminal K of the thyristor. The negative potential at the terminal 91 is connected to the gate terminal GI of the thyristor 1 via a switch 5 and a concretely incorporated or parasitically existing inductance 6 in the event of turning off. It is now of particular advantage if the control terminal G of the transistor 4 is connected to the negative potential at the terminal 91 of the supply voltage. It is assured in this manner that the transistor, in normal operation of the thyristor, is always cut off and the shunt is therefore ineffective. Thereby, no additional losses of any kind occur in normal operation.

Figure 5:
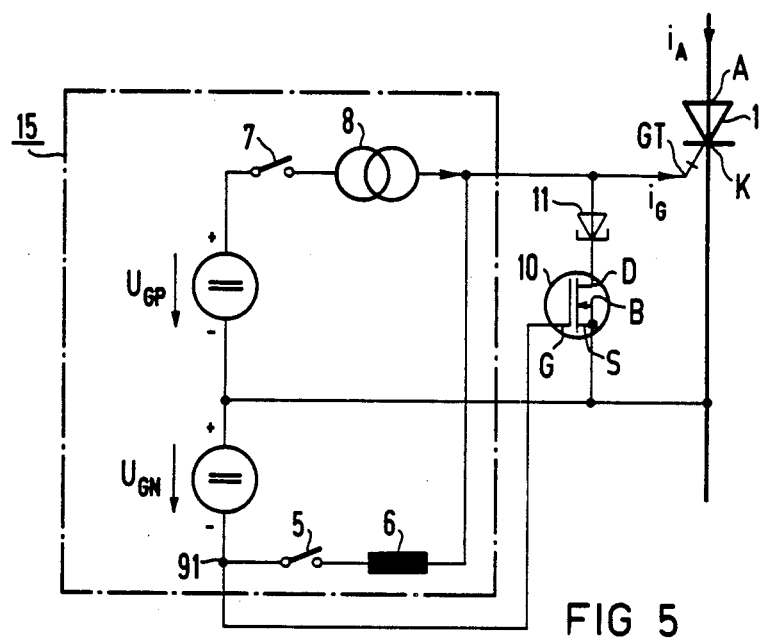
FIG. 5 shows a further embodiment with an MOS field-effect transistor and a series-connected diode as a shunt.

FIG. 5 shows a further, particularly advantageous embodiment of the device according to the invention. The electrically controlled switching element used here is a self-conducting n-channel power MOS field-effect transistor 10 which is designated as a "MOS-FET" for short. The latter is particularly well suited due to its low-power drive and its low drain-source resistance. In field-effect transistors of this type, a so-called inverse diode is as a rule effective between the source and the drain electrode due to its vertical internal structure. This diode shorts the transistor on the output side when the sign of the drain-source voltage, which is positive in normal operation, is reversed. This may be desirable in inverter circuits since thereby, so-called bypass diodes can be eliminated. In the present case, on the other hand, this short circuit must be prevented likewise by a series diode 11 arranged in the forward direction relative to the transistor drain-source path, since otherwise the shunt would become effective also if the thyristor is turned off.

Schottky diodes are particularly advantageously suited for this purpose. Due to the low forward voltage of this component, the low resistance of the shunt is hardly effected thereby. The MOS-FET can be driven here in the same manner a in the embodiment according to FIG. 3 by connecting the gate electrode via the diode 41 to the gate terminal of the thyristor. Likewise, the MOS-FET can be driven in accordance with the embodiment as per FIG. 4, as is also shown in FIG. 5. There, the driver 15 used is expanded for driving the thyristor, for example, by the essential switching elements which are required for turning it on. These are in particular a further supply voltage $U_{GP}$, the negative potential of which is connected to the thyristor cathode terminal; a further switch 7 and a voltage-controlled current source 8 for impressing the switching-on gate current $i_G$.

Figure 6:
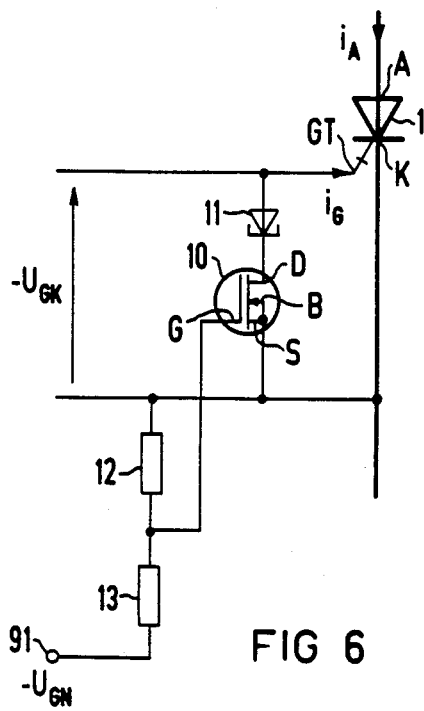
FIG. 6 shows a further embodiment with an additional voltage divider for driving the field-effect transistor.

For adapting to different field-effect transistor types, especially with different threshold voltages, the supply voltage $U_{GN}$ which in normal operation blocks the transistor can advantageously be adapted to the field-effect transistor data via a voltage divider. According to the embodiment as per FIG. 6, the latter consists of the two resistors 12 and 13 and is connected via the terminal 91 at the negative potential of the supply voltage $U_{GN}$ and to the cathode terminal of the thyristor. The transistor gate is connected between the two resistors.

Figure 7:
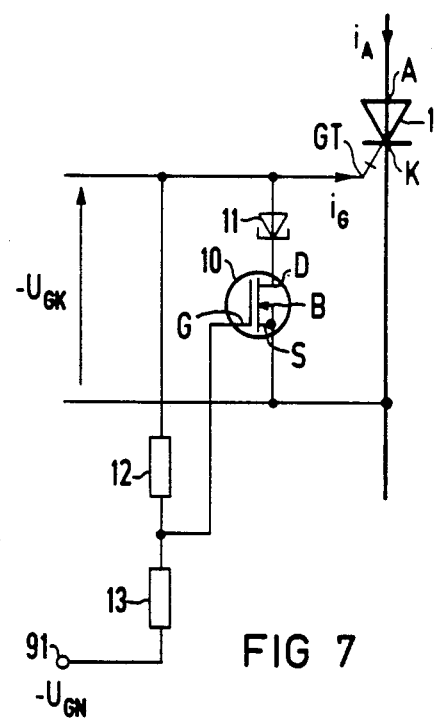
FIG. 7 shows a further embodiment with a different arrangement of the voltage divider and FIG. 8 shows a further embodiment using multiple parallel connected field effect transistors.

In a further embodiment of the invention, it is particularly advantageous if especially in the case of an MOS-FET as a shunt, the voltage divider is connected between the negative potential of the supply voltage $U_{GN}$ and the gate terminal GT of the thyristor. This case is shown in the embodiment according to FIG. 7. In contrast to n-channel barrier layer field-effect transistors, the input control characteristic of a self conducting n-channel MOS field effect transistor lies, besides in the second quadrant of the $U_{GS}/I_D$ field of characteristics, also in the first quadrant. By applying a positive gate-source voltage, it is possible to increase the drain current and thereby the conductivity of the transistor further. Since in this case, there is no potential difference between the terminal 91 of the voltage source $U_{GN}$ and the cathode of the thyristor, a positive gate-source voltage is built up at the control path of the MOS-FET by the portion of the thermal cut-off current $-i_G$ flowing through the voltage divider 12, 13. In this manner, a "positive coupling" of the transistor is brought about, which further reduces the forward resistance of the shunt.

Figure 8:
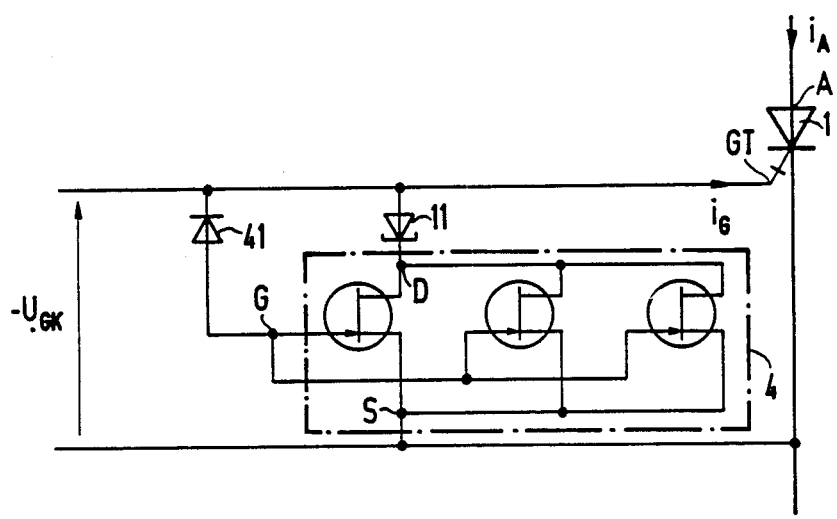

For further reducing the forward resistance, it is particularly advantageous to realize the electrically controllable switching element in the shunt and in particular the field-effect transistor practically from a number of similar switching elements connected directly to the conduction paths, i.e., to the drain-source paths, which are driven simultaneously. See FIG. 8

In the foregoing specification, the invention has been described with reference to exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A device coupled to a gate-turn-off thyristor having an anode, cathode and gate, for maintaining a switching state of the thyristor interrupting current flow between the anode and cathode in the event of a failure of a negative control voltage causing and maintaining said switching state in normal operation between the gate and cathode of the thyristor, comprising:
   a low resistance shunt comprising a self-conducting n-channel field-effect transistor that can be coupled to the thyristor, said transistor having a gate electrode, a source electrode and a drain electrode, the drain and source electrode, respectively, of the field-effect transistor being connected to the gate and cathode, respectively of the thyristor; and
   a diode arranged in a forward direction from the gate electrode of the field-effect transistor to the gate of the thyristor.

2. The device recited in claim 1, wherein the self-conducting n-channel field-effect transistor is a power MOS field-effect transistor having an inverse diode with current-carrying action from the source to the drain electrode, said transistor being connected in a series circuit with a further diode with a low forward voltage arranged in a forward direction in the series circuit from the gate to the cathode of the thyristor.

3. The device recited in claim 2, wherein the further diode connected in series with the field effect transistor is a Schottky diode.

4. The device recited in claim 1, wherein the low-resistance shunt comprises several parallel-connected field-effect transistors, the gate electrodes of which are connected to each other.

5. A device coupled to a gate-turn-off thyristor having an anode, cathode and gate, for maintaining a switching state of the thyristor interrupting current flow between the anode and cathode in the event of a failure of a negative control voltage causing and maintaining said switching state in normal operation between the gate and cathode of the thyristor, comprising:
   a low resistance shunt comprising a self-conducting n-channel field-effect transistor that can be coupled to the thyristor, said transistor having a gate electrode, a source electrode and a drain electrode, the drain and source electrode, respectively, of the field-effect transistor being connected to the gate and cathode, respectively of the thyristor; and
   the gate electrode of the field-effect transistor being connected to the negative control voltage, said field effect transistor being maintained in a nonconductive state by said negative control voltage independent of whether a turn-on voltage is present at the gate of said thyristor and becoming conductive if said negative voltage fails.

6. The device recited in claim 5, further comprising an ohmic voltage divider coupled between the negative control voltage and the cathode terminal of the thyristor and having a center terminal connected to the gate electrode of the field-effect transistor.

7. The device recited in claim 5, wherein the self-conducting n-channel field-effect transistor is a power MOS field-effect transistor having an internal inverse diode with current-carrying action from the source to the drain electrode, said transistor being connected in a series circuit with a further diode with a low forward voltage arranged in a forward direction in the series circuit from the gate to the cathode terminal of the thyristor.

8. The device recited in claim 5, further comprising an ohmic voltage divider connected between the negative control voltage and the gate terminal of the thyristor and having a center terminal connected to the gate electrode of the field-effect transistor.

9. The device recited in claim 7, further comprising an ohmic voltage divider connected between the negative control voltage and the gate terminal of the thyristor and having a center terminal connected to the gate electrode of the field-effect transistor.

10. The device recited in claim 7, wherein the further diode connected in series with the field effect transistor is a Schottky diode.

11. The device recited in claim 5, wherein the low-resistance shunt comprises several parallel-connected field-effect transistors, the gate electrodes of which are connected to each other.

* * * * *